(12) United States Patent
Cideciyan et al.

(10) Patent No.: US 8,930,798 B2
(45) Date of Patent: Jan. 6, 2015

(54) DATA ENCODING IN SOLID STATE STORAGE DEVICES

(75) Inventors: Roy D. Cideciyan, Rueschlikon (CH); Evangelos S. Eleftheriou, Rueschlikon (CH); Thomas Mittelholzer, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 125 days.

(21) Appl. No.: 13/582,768

(22) PCT Filed: Mar. 23, 2011

(86) PCT No.: PCT/IB2011/051219
§ 371 (c)(1),
(2), (4) Date: Sep. 5, 2012

(87) PCT Pub. No.: WO2011/121490
PCT Pub. Date: Oct. 6, 2011

(65) Prior Publication Data
US 2013/0013974 A1 Jan. 10, 2013

(30) Foreign Application Priority Data
Mar. 30, 2010 (EP) ..................... 10158438

(51) Int. Cl.
H03M 13/00 (2006.01)
H03M 13/29 (2006.01)
H03M 13/15 (2006.01)
G06F 11/10 (2006.01)

(52) U.S. Cl.
CPC ...... *H03M 13/2906* (2013.01); *H03M 13/2942* (2013.01); *H03M 13/152* (2013.01); *G06F 11/1072* (2013.01)
USPC ........... 714/782; 714/792; 714/752; 714/755; 714/762; 341/94

(58) Field of Classification Search
None
See application file for complete search history.

(56) References Cited

U.S. PATENT DOCUMENTS 5,942,005 A 8/1999 Hassner et al.
5,946,328 A * 8/1999 Cox et al. ..................... 714/784

(Continued)

FOREIGN PATENT DOCUMENTS

| CN | 101227194 A | 7/2008 |
|---|---|---|
| EP | 0969480 A1 | 1/2000 |
| JP | H11212876 A | 8/1999 |

OTHER PUBLICATIONS

M. Hassner, et al., "Integrated Interleaving—A Novel ECC Architecture," IEEE Transactions on Magnetics, vol. 37, No. 2, pp. 773-775, Mar. 2001.*

(Continued)

Primary Examiner — John Trimmings
(74) Attorney, Agent, or Firm — Cantor Colburn LLP

(57) ABSTRACT

Methods and apparatus are provided for encoding input data for recording in s-level storage of a solid state storage device, where s f 2. Input data words are encoded in groups of M input data words in accordance with first and second BCH codes to produce, for each group, a set of M first codewords of the first BCH code. The set of M first codewords is produced such that at least one predetermined linear combination of the M first codewords produces a second codeword of the second BCH code, this second BCH code being a sub-code of the first BCH code. The sets of M first codewords are then recorded in the s-level storage. If each of the first and second codewords comprises N q-ary symbols where $q=p^k$, k is a positive integer and p is a prime number, the q-ary code alphabet can be matched to the s-ary storage by ensuring that q and s are $u^{th}$ and $v^{th}$ powers respectively of a common base r, where u and v are positive integers and k f u, whereby $p^{(k/u)v}=s$.

11 Claims, 2 Drawing Sheets

(56) References Cited

U.S. PATENT DOCUMENTS

| | | | |
|---|---|---|---|
| 6,275,965 B1* | 8/2001 | Cox et al. ............... | 714/755 |
| 6,732,322 B1* | 5/2004 | Miyauchi et al. ......... | 714/784 |
| 7,047,478 B2* | 5/2006 | Gregori et al. ............ | 714/773 |
| 7,231,578 B2 | 6/2007 | Hassner et al. | |
| 8,006,171 B2* | 8/2011 | Wang ....................... | 714/782 |
| 2007/0124652 A1 | 5/2007 | Litsyn et al. | |
| 2008/0168329 A1 | 7/2008 | Han et al. | |
| 2009/0040081 A1* | 2/2009 | Yang et al. ............... | 341/94 |
| 2012/0240006 A1* | 9/2012 | Hu et al. .................. | 714/756 |

OTHER PUBLICATIONS

E. L. Blokh and V. V. Zyablov, "Generalized concatenated codes," Plenum Publishing Corporation, pp. 218-222, 1976 (translated from Problemy Peredachi Informatsii, vol. 10, No. 3, pp. 45-50, Jul.-Sep. 1974; Foreign and Translation Copy Attached).

Helmut Griesser, et al., "A Generalised Concatenated Error Correcting Code for Optical Fibre Transmission," ECOC, Kloosterstraat, Assenede Belgium, pp. 1-2, 2004.

Junsheng Han, et al.,"Reliable Memories with Subline Accesses," ISIT2007, Nice, France, Jun. 2007, pp. 2531-2535.

Haruhiko Kaneko, et al., "Three-Level Error Control Coding for Dependable Solid-Sate Drives," 14th IEEE Pacific Rim International Symposium on Dependable Computing, pp. 1-8, 2008.

Khaled A.S. Abdel-Ghaffar and Martin Hassner, "Multilevel Error-Control Codes for Data Storage Channels," IEEE Transactions on Information Theory; 37, No. 3, New York, pp. 1-8, May 1991.

Shu Lin and Daniel J. Costello, "Error Control Coding," Pearson Education International, XP000002650451, Chapter 7, "Nonbinary BCH Codes, Reed-Solomon Codes, and Decoding Algorithms," Only p. 234.

J Maucher et al,"On the Equivalence of Generalized Concatenated Codes and Generalized Error Location Codes," IEEE Trans. on Information Theory, vol. 46, No. 2, Mar. 2000, pp. 642-649.

International Search Report; International Application No. PCT/IB2011/051219; International Filing Date: Mar. 23, 2011; Date of Mailing: Jul. 28, 2011; pp. 1-5.

International Search Report—Written Opinion; International Application No. PCT/IB2011/051219; International Filing Date: Mar. 23, 2011; Date of Mailing: Jul. 28, 2011; pp. 1-12.

Manuel T., "The Big Move is Underway to Photo-Like PC Graphics," Electonics, Jul. 1988, 0701, VNU Business Publications, NY, vol. 61, Nr. 13, pp. 105-109.

H. Choi et al., "VLSI Implementation of BCH Error Correction for Multilevel Cell NAND Flash Memory, IEEE Transactions on Very Large Scale Integration (VLSI) Systems", vol. 18, No. 5, p. 843-847, May 2010.

\* cited by examiner

☐ 1st BCH codeword (N q-ary symbols)
▨ 2nd BCH codeword (N q-ary symbols)

Two-level codeword format:

Condition:

□ 1st BCH codeword (N q-ary symbols)
▨ 2nd BCH codeword (N q-ary symbols)

Two-level codeword format:

| 1 | 2 | 3 | ... | M |

Condition:

$h^*_{0,0} * [1] + h^*_{0,1} * [2] + h^*_{0,2} * [3] + \cdots h^*_{0,M-1} * [M] = \text{▨}$ $h^*_{1,0} * [1] + h^*_{1,1} * [2] + h^*_{1,2} * [3] + \cdots h^*_{1,M-1} * [M] = \text{▨}$ $\vdots$ $h^*_{P-1,0} * [1] + h^*_{P-1,1} * [2] + h^*_{P-1,2} * [3] + \cdots h^*_{P-1,M-1} * [M] = \text{▨}$

Figure 3

DATA ENCODING IN SOLID STATE STORAGE DEVICES

PRIORITY

This is a U.S. national stage of application No. PCT/IB2011/051219, filed on Mar. 23, 2011. Priority under 35 U.S.C. §119(a) and 35 U.S.C. §365(b) is claimed from European Patent Application No. 10158438.1, filed Mar. 30, 2010, and all the benefits accruing therefrom under 35 U.S.C. §119, the contents of which in its entirety are herein incorporated by reference.

BACKGROUND

This invention relates generally to data encoding in solid state storage devices (SSDs). Methods and apparatus are provided for encoding data and recording the encoded data in s-level solid state storage, where s f 2 represents the number of different values, or levels, that can be assumed by the fundamental storage unit, or "cell", of the solid state memory.

Solid-state storage is memory which uses electronic circuitry, typically in integrated circuits, for storing data rather than conventional magnetic or optical media like disks and tapes. Solid state storage devices such as flash memory devices are currently revolutionizing the data storage landscape. These devices are more rugged than conventional storage devices due to the absence of moving parts, and offer exceptional bandwidth, significant savings in power consumption, and random I/O (input/output) performance that is orders of magnitude better than hard disk drives (HDDs).

Conventional storage devices such as HDDs record binary data. That is, the fundamental storage unit in these devices holds only one bit of information. Volatile solid state memory technologies such as DRAMs (dynamic random access memories) also record binary data, the fundamental storage cell in such memories being capable of assuming only two levels (s=2), and hence recording only binary values. In other types of SSD, however, the storage cells can assume more than two levels (s>2). For example, flash memory and phase change memory (PCM), two important non-volatile memory technologies, allow multi-level recording. NOR flash memories, for instance, can store 4 levels, i.e., 2 bits, per cell. Multi-level cell (MLC) NAND flash memory chips that can store 4 bits of data per single flash cell using 43 nm process technology are currently available. The PCM technology is expected to supplant flash memory technologies when process technologies below 10 nm are required. Although commercially available PCM chips currently store only one bit per cell, storage of 4 bits per cell in PCM chips has already been experimentally demonstrated.

Due to the success of solid state memories such as flash and PCM in consumer products like digital cameras and music players, these memory technologies are currently being considered for enterprise storage. Error performance, which is always a key issue for data storage devices, becomes increasingly important as these technologies move into the enterprise space. While conventional storage devices like HDDs have an ECC (error correction code) overhead of about 10% to 15%, the ECC overhead in commercially available flash memories is only about 2.5% to 5%. Efficiency is therefore critical for EC coding schemes in these devices.

In SSDs, the storage is organized into storage areas, or blocks, each of which contains a set of storage locations to which data can be written. EC coding is performed in SSDs by adding redundancy at the write-unit level, i.e. within each data write location. Flash memory, for example, contains data write locations known as "pages". Each page contains a plurality of sectors, but write operations are usually performed on a page basis. An EC code is computed for the input data written to each flash page, or each sector within a page, and the EC code is recorded in that page, or sector, with the input data. This coding allows recovery from errors within individual data pages. Linear codes such as RS (Reed-Solomon) and BCH (Bose-Chaudhuri-Hocquenghem) codes have been employed for this so-called "one-level" EC coding. "Long" one-level codes, where the encoding is performed on a page basis (i.e. one codeword per page) make the best use of available page redundancy and therefore give the best error performance, but these schemes are extremely complex to implement and require high power consumption if the page size and the desired error correction capability is large. The complexity associated with these codes depends on the size of the finite field (the Galois field (GF)) in which the encoding and decoding arithmetic is performed. (In the following, the set of all N-tuples with elements from the Galois field with q elements, denoted by GF(q), is a vector space denoted by $GF(q)^N$). For example, long one-level codes for two different page sizes with a payload of 2 KiB and 4 KiB have been designed. It was assumed that the available ECC overhead (redundancy) of the long one-level codes with payloads of 2 KiB and 4 KiB was 56 bytes and 120 bytes, respectively. The best 2 KiB one-level RS code (where 2 KiB is the page size) can correct up to 20 randomly selected 11-bit symbols per page but requires $GF(2^{11})$ arithmetic both for encoding and decoding. The best 4 KiB one-level RS code can correct up to 40 randomly selected 12-bit symbols in a page but requires $GF(2^{12})$ arithmetic for encoding and decoding. Moreover, the best 2 KiB one-level BCH code, which can correct up to 29 randomly selected bits per page, requires GF(2) arithmetic for encoding but $GF(2^{15})$ arithmetic for decoding. The best 4 KiB one-level BCH code, which can correct up to 60 randomly selected bits per page, requires GF(2) arithmetic for encoding but $GF(2^{16})$ arithmetic for decoding. Because of the inordinate complexity of these long codes, "short" one-level codes, where multiple shorter codewords are contained in a single page, are used in practice, sacrificing error performance for practicality of implementation.

U.S. Pat. No. 7,047,478 B2 discloses a one-level coding system for multi-level cell memory in which the operating mode is switchable from a mode in which all available storage levels are used to a mode in which less than all levels are used. To accommodate this, the coding scheme employs a q-ary alphabet (i.e. the codewords are formed of symbols which can take q different values) where q is equal to the number of available levels s of the multilevel cells.

As described in "Integrated Interleaving—A Novel ECC Architecture," M. Hassner, et al., IEEE Trans. on Magn., vol. 37, no. 2, pp. 773-775, March 2001, and U.S. Pat. Nos. 5,946,328, 5,942,005 and 7,231,578 B2, two-level coding schemes using interleaved RS codes have been employed in HDDs. These systems are based on the generalized concatenated codes described, for example, in: E. L. Blokh and V. V. Zyablov, "Generalized concatenated codes," Plenum Publishing Corporation, pp. 218-222, 1976 (translated from Problemy Peredachi Informatsii, vol. 10, No. 3, pp. 45-50, July-September, 1974); and J. Maucher et al., "On the Equivalence of Generalized Concatenated Codes and Generalized Error Location Codes", IEEE Trans. on Information Theory, vol. 46, no. 2, March 2000. The two-level RS coding scheme of Hassner et al. referenced above uses first and second RS codes, denoted by C1 and C2 respectively, where the second RS code is a sub-code of the first RS code. A set of M first (C1) codewords is generated such that a linear combination of these M codewords is a second (C2) codeword. In particular, a number B f 1 of weighted sums of the M C1 codewords in the aforementioned set are respective C2 codewords of the second RS code. The weighting coefficients for these weighted sums are defined by a Vandermonde matrix. In addition, the coding scheme is subject to the limitation M<q, i.e. the number of C1 codewords M in the aforementioned set is less than the total number of Galois field elements q. For example, in the case of binary linear codes over GF(q=2) the condition M<2 applies for integrated interleaving codes, i.e., M=1 and so the family of integrated interleaving codes defined by Hassner et al. does not contain binary two-level codes. The use of multiple RS codewords, interleaved over a sector, in this scheme increases the robustness to burst errors in the HDD channel. RS codes are well suited to this and are widely favoured in general. This may be due in part to the ease of performance evaluation since the weight distributions of RS codes are known. Implementation complexity also compares favourably with BCH codes as illustrated above, decoding in particular being significantly less complex for RS codes.

Two-level RS coding has also been adopted for DRAMs as discussed in "Reliable Memories with Subline Accesses", Junsheng Han et al., ISIT2007, Nice, France, June 24-June 29, pp. 2531-2535, and US Patent Application No. 2008/0168329 A1. The two-level RS coding is based on the integrated interleaving scheme of Hassner et al. referenced above though code design details and decoding algorithms are unspecified.

BRIEF DESCRIPTION OF THE SEVERAL VIEWS OF DRAWINGS

Preferred embodiments of the invention will now be described, by way of example, with reference to the accompanying drawings in which:

FIG. 3 illustrates a second two-level coding scheme for use in the FIG. 1 device.

DETAILED DESCRIPTION

Figure 1:
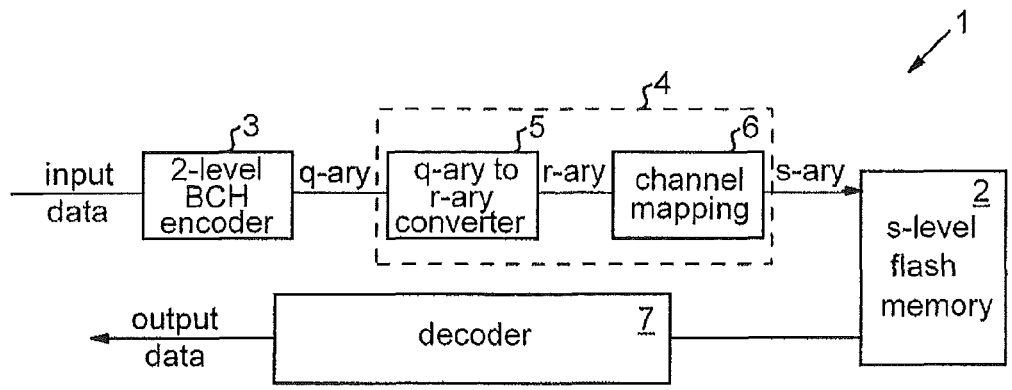
FIG. 1 is a schematic block diagram of an s-level solid state storage device embodying the invention.

One embodiment of an aspect of the present invention provides a method for recording input data in s-level storage of a solid state storage device, where s f 2. The method comprises:

encoding input data words in groups of M input data words in accordance with first and second BCH codes to produce, for each group, a set of M first codewords of the first BCH code such that a predetermined linear combination of the M first codewords produces a second codeword of the second BCH code, wherein the second BCH code is a sub-code of the first BCH code; and recording the sets of M first codewords in the s-level storage.

In contrast to the established use of RS codes discussed above, methods embodying the present invention employ BCH codes for two-level encoding in s-level solid state storage devices. Embodiments of the present invention are predicated in part on the realization that BCH codes are particularly well suited to correcting the error patterns in SSD storage channels. In addition, by employing a two-level BCH coding scheme, the error performance advantage can be exploited while minimizing the impact of decoder complexity. Indeed, good error rate performance can be achieved with minimal penalty in terms of implementation complexity. By utilizing BCH codes, in spite of perceived drawbacks, for two-level coding in SSDs, highly efficient error correction schemes, with low implementation complexity and low power consumption, can be achieved. Moreover, as discussed further below, the BCH code characteristics can be readily tailored to suit the number of levels s of the SSD cells and the error structure of the SSD channel. Overall, therefore, recording methods embodying the invention may provide practical and efficient systems for reliable storage of information in s-level solid state memories.

In general, input data words to be encoded may comprise a plurality of data symbols, where the data symbols may be single bit (i.e. binary) symbols or plural-bit symbols. In preferred embodiments of the invention, each of the first and second codewords comprises a plurality (denoted by N) of q-ary symbols where $q=p^k$, k is a positive integer and p is a prime number. Moreover, in particularly preferred embodiments, the q-ary alphabet of the two-level BCH code is tailored to the number of levels s of the solid state storage for particularly efficient operation. This is achieved through use of a code for which q and s are $u^{th}$ and $v^{th}$ powers respectively of a common base r, where u and v are positive integers and k f u. This ensures that the q-ary code alphabet is "matched" to the s-ary storage according to the condition $p^{(k/u)v}=s$. By ensuring that the code satisfies this "matched alphabet" constraint, the q-ary codeword symbols can be simply and efficiently converted to an s-ary alphabet for recording in the s-level storage, providing highly efficient operation as well as flexibility of code choice. In particular, while q and s might be the same in some instances, preferred embodiments will be detailed below in which q ! s. In addition, while methods embodying the invention can be applied to binary (s=2) solid state storage, preferred embodiments provide flexible and efficient operation for multi-level solid state storage (s>2).

In particularly preferred embodiments, each set of M first codewords is recorded in a respective write location of the solid state storage. In flash memory for example, each page will then contain a single set of M first codewords. However, it may be desirable in some embodiments to record a plurality of the sets of M first codewords in each write location, for instance one set per sector of a flash page. Embodiments might also be envisaged where each set of M first codewords is recorded in a plurality of write locations of the solid state storage.

According to an embodiment of another aspect of the invention there is provided a computer program comprising program code means for causing a computer to perform a method according to the first aspect of the invention. It will be understood that the term "computer" is used in the most general sense and includes any device, component or system having a data processing capability for implementing a computer program. Moreover, a computer program embodying the invention may constitute an independent program or may be an element of a larger program, and may be supplied, for example, embodied in a computer-readable medium such as a disk or an electronic transmission for loading in a computer. The program code means of the computer program may comprise any expression, in any language, code or notation, of a set of instructions intended to cause a computer to perform the method in question, either directly or after either or both of (a) conversion to another language, code or notation, and (b) reproduction in a different material form.

An embodiment of a third aspect of the invention provides a solid state storage device comprising:
  s-level solid state storage, where s ≧ 2; and
  a two-level BCH encoder for encoding input data words in groups of M input data words in accordance with first and second BCH codes to produce, for each group, a set of M first codewords of the first BCH code such that a predetermined linear combination of the M first codewords produces a second codeword of the second BCH code, wherein the second BCH code is a sub-code of the first BCH code;
  wherein the device is adapted to record the sets of M first codewords in the s-level storage.

An embodiment of a fourth aspect of the invention provides an encoder apparatus for encoding input data to be recorded in s-level storage of a solid state storage device, where s ≧ 2. The encoder apparatus comprises:
  a two-level BCH encoder for encoding input data words in groups of M input data words in accordance with first and second BCH codes to produce, for each group, a set of M first codewords of the first BCH code such that a predetermined linear combination of the M first codewords produces a second codeword of the second BCH code, wherein the second BCH code is a sub-code of the first BCH code, wherein each of the first and second codewords comprises N q-ary symbols where q ≠ s, $q=p^k$, k is a positive integer and p is a prime number, and wherein q and s are $u^{th}$ and $v^{th}$ powers respectively of a common base r, where u and v are positive integers and k ≠ u, whereby $p^{(k/u)v}=s$; and
  a symbol converter for converting the q-ary symbols of each first codeword to an s-ary alphabet for recording in the s-level storage.

In general, where features are described herein with reference to an embodiment of one aspect of the invention, corresponding features may be provided in embodiments of another aspect of the invention.

FIG. 1 is a simplified schematic of a solid state storage device, here a flash memory device 1, showing the key elements involved in the encoding system to be described. The device 1 includes s-level flash memory 2 for storing data in integrated arrays of flash memory cells, where each cell can assume s ≧ 2 different storage levels. Though shown as a single block in the figure, in general flash memory 2 may comprise any desired configuration of flash storage units ranging, for example, from a single chip or die to a plurality of storage banks each containing multiple packages of storage chips. The device 1 has encoder apparatus shown in generalized form as comprising a two-level BCH encoder 3 and a symbol converter 4 which is bounded by the dashed line in the figure. The symbol converter 4 comprises a q-ary to r-ary converter 5 and a channel mapping unit 6. The corresponding decoder apparatus of device 1 is indicated generally as decoder 7 in the figure.

In general, functionality of BCH encoder 3, symbol converter 4 and decoder 7 could be implemented in hardware, software or a combination thereof. For example, the encoding operation in BCH encoder 3 could be performed in whole or in part by software which configures a processor of the encoder apparatus to implement the coding scheme detailed below. Suitable software will be apparent to those skilled in the art from the description herein. For reasons of operating speed, however, the use of hardwired logic circuits is generally preferred to implement functionality as far as possible. In addition, the encoding process could be implemented in general by systematic encoding (where the input data to the encoding process is unchanged by the coding but a parity code is added to the unencoded symbols to obtain the output codeword) or by non-systematic encoding (where the input data to the encoding process is embedded by the coding in the output codeword). Systematic encoding is preferred, however, for simplicity of encoder (and corresponding decoder) implementation. Suitable implementations of the encoder and decoder apparatus of device 1 will be readily apparent to those skilled in the art from the description herein.

In operation of device 1, input data to be recorded in flash memory 2 is supplied to BCH encoder 3. The input data comprises a succession of input data words, these being encoded by BCH encoder 3 in groups of M input data words in accordance with a two-level BCH encoding scheme to be described in detail below. For each group of M input data words (which may comprise words with different numbers of data symbols as explained below), BCH encoder 3 outputs a set of M of q-ary symbol codewords (i.e. a single symbol of these codewords can have q possible values), where $q=p^k$, k is a positive integer and p is a prime number. Depending on the relationship between q and s, symbol converter 4 operates as discussed further below to convert the q-ary symbol codewords to an s-ary alphabet for recording. The s-ary symbol codewords are then recorded in flash memory 2 whereby each flash cell stores one s-ary symbol of a codeword. In this embodiment, each page of the flash memory provides sufficient storage for a single set of M s-ary codewords, whereby each set of M s-ary codewords is stored in a respective flash page. When a page is subsequently read from flash memory 2, decoder 7 performs the inverse processing to encoder apparatus 3, 4 for decoding the s-ary codewords, and implements error detection and recovery operations in generally known manner. The original input data words are thereby recovered and supplied as output data from decoder 7.

The operation of BCH encoder 3 will now be explained in more detail. Each group of M input data words supplied to encoder 3 consists of (M−P) $K_1$-symbol data words from the vector space $GF(q)^{K_1}$ and P $K_2$-symbol data words from the vector space $GF(q)^{K_2}$. The encoder 3 maps the (M−P) $K_1$-symbol data words into respective N-symbol first codewords in accordance with a first BCH code. This first BCH code consists of a predefined set of N-tuples from the vector space $GF(q)^N$. Thus, the code maps input q-ary symbol data words to q-ary symbol first codewords on a one-to-one basis, where N−$K_1$ parity symbols in each of the (M−P) first codewords provide a first part of the redundancy necessary for the ECC process. Furthermore, the encoder 3 maps the remaining P $K_2$-symbol data words into respective N-symbol second codewords in accordance with a second BCH code. This second BCH code consists of another predefined set of N-tuples from the vector space $GF(q)^N$ and is a sub-code of the first BCH code, i.e. the set of all second codewords is a subset of the set of all first codewords. Thus, the second code maps input q-ary symbol data words to q-ary symbol second codewords (which are also first codewords) on a one-to-one basis, where N−$K_2$ parity symbols in each of the P codewords provide a second part of the redundancy necessary for the ECC process. Thus, the encoder generates an initial set of M codewords. Then, a final set of M codewords is obtained by replacing the P second codewords in the initial set by P modified (first) codewords in which the i-th symbol (where i=1 to N) of each modified codeword is a particular linear combination of the i-th symbols of the M codewords in the initial set. These modified codewords are generated such that the final set of M first codewords is constrained by the second BCH code. Specifically, at least one predetermined linear combination of the set of M first codewords is a codeword of the second BCH code. Thus, the resulting set of M first codewords, when combined according to one or more predetermined linear combinations, produces one or more second codewords of the second BCH code.

While the foregoing describes an exemplary implementation for the two level coding scheme in encoder 3, various two-level code constructions can be envisaged. According to embodiments of the invention, each group of M input data words is encoded in accordance with first and second BCH codes to produce a set of M first codewords of the first BCH code such that a predetermined linear combination of the M first codewords produces a second codeword of the second BCH code, this second code being a sub-code of the first BCH code. A simple example is illustrated schematically in FIG. 2. The first and second codewords are represented by the two different rectangular blocks at the top of the figure. The second codewords, like the first codewords, each consist of N q-ary symbols as indicated. For a given group of M input data words, the resulting set of M first codewords, when concatenated in a defined order, effectively form a two-level codeword of the overall two-level BCH code as shown in the centre of the figure. This two-level codeword satisfies the condition illustrated at the bottom of the figure. That is, the sum (symbol-by-symbol) of the M first codewords produces a codeword of the second BCH code.

Another exemplary two-level coding scheme is illustrated in FIG. 3. In this case, each of a plurality of linear combinations of the M first codewords produces a codeword of the second BCH code. In particular, for a defined concatenation order, each of a plurality of weighted sums of the M first codewords is a respective second codeword. This is illustrated in a generalized form by the condition at the bottom of the figure, where "*" denotes multiplication. In particular, second codewords are obtained from P weighted sums of the M codewords, where the weighting coefficients for these weighted sums are defined by a parity-check matrix corresponding to a third, linear code as explained in the following.

This class of two-level BCH codes C over the finite field GF(q) is based on the definition of three codes $C_1$, and $C_2$ and C*, over the finite field GF(q) where q is a power of a prime number. The code $C_1$ is the first BCH code $[N,K_1,d(C_1)]$ with minimum distance $d(C_1)$ defined by the $(N-K_1) \times N$ parity-check matrix $H_1$. The second code $C_2$ is the second BCH code $[N,K_2,d(C_2)]$ with minimum distance $d(C_2)$. This is a sub-code of the first code $C_1$ and is defined by the $(N-K_2) \times N$ parity-check matrix $$H_2 = \begin{bmatrix} H_1 \\ H_a \end{bmatrix}$$

where $H_a$ is a $(K_1-K_2) \times N$ parity-check matrix representing the parity check constraints that the $C_2$ code must satisfy in addition to the parity check constraints $H_1$. Let $H^* = [h^*_{i,j}]$ be any full-rank parity check matrix over GF(q) of size P×M, which defines a linear [M, K*, d(C*)] code of dimension K*=M-P and with minimum distance d(C*). The overall two-level code C of length MN, which is obtained from the linear code C* with parity check matrix $H^* = [h^*_{i,j}]$ and the codes $C_1$ and $C_2$, where $C_2 \subset C_1$, is defined by the parity check matrix $$H = \begin{bmatrix} H_1 & 0 & \cdots & 0 \\ 0 & H_1 & \cdots & 0 \\ \vdots & \vdots & \vdots & \vdots \\ 0 & 0 & \cdots & H_1 \\ & & H_b & \end{bmatrix} \text{ where}$$

$$H_b = \begin{bmatrix} h^*_{0,0}H_a & h^*_{0,1}H_a & \cdots & h^*_{0,M-1}H_a \\ h^*_{1,0}H_a & h^*_{1,1}H_a & \cdots & h^*_{1,M-1}H_a \\ \vdots & \vdots & \vdots & \vdots \\ h^*_{P-1,0}H_a & h^*_{P-1,1}H_a & \cdots & h^*_{P-1,M-1}H_a \end{bmatrix}$$

is a block matrix of size $[(N-K_1)M+(K_1-K_2)P] \times [MN]$, which can also be characterized by $H_b = [h^*_{i,j}H_a]$ based on using a simple representation of the (i,j)-th sub-block of $H_b$. The matrix elements $h^*_{i,j}$ here give the weighting coefficients for the weighted sums in FIG. 3. It can be shown that the resulting two-level code C of length MN has dimension $K^*K_1 + P K_2$ and minimum distance:

$$d(C) = \min\{d(C^*)d(C_1), d(C_2)\}.$$

Figure 2:
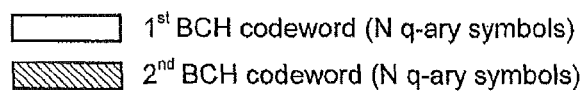
FIG. 2 illustrates a first two-level coding scheme for use in the FIG. 1 device.
Figure 2:
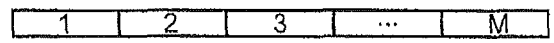

It will be appreciated that numerous two-level BCH codes can be constructed according to the coding architectures of FIGS. 2 and 3, and particular codes $C_1$, and $C_2$ and C*, can be selected according to the parameters of individual systems. Specific codes can be selected, for example, based on the number of levels s of the s-ary storage and the performance requirements of a given system. To enhance performance efficiency and simplify implementation, however, in preferred embodiments of device 1 the BCH code is selected such that:

$$q = p^k = r^\mu, \text{ where } k f u; \text{ and} \quad (1)$$

$$s = r^v. \quad (2)$$

where u and v are positive integers. In other words, q and s are $u^{th}$ and $v^{th}$ powers respectively of a common base r. This implies the condition:

$$p^{(k/u)v} = s$$

which is referred to herein as the "matched alphabet" constraint. Satisfying this constraint ensures that the q-ary alphabet of the two-level BCH code is matched to the s-ary storage for most efficient device operation. In particular, flexibility of coding choice is provided while ensuring that the q-ary code can be simply and efficiently converted to an s-ary alphabet in symbol converter 4. Hence, coding schemes are not limited to those for which q=s, but can be selected to give best results for the particular s-level storage characteristics. In operation of device 1 where s ! q, the q-ary symbol codewords are converted to r-ary symbol codewords by q-ary to r-ary converter 5, where $r^v = s$ as defined above. If v>1 here (i.e., r ! s), then the r-ary symbols can then be mapped to the s storage channels of memory 2 in channel mapping unit 6. In particular, successive sets of v r-ary symbols of each r-ary input codeword are mapped to respective corresponding levels of the s-level storage in accordance with a predetermined mapping scheme which maps all possible values of v r-ary symbols to different ones of the s levels. The channel mapping can be performed in any desired manner here, for example using a known Gray mapping scheme, to suit the error characteristics of the s-ary storage as will be apparent to those skilled in the art. Each set of v r-ary input symbols thus corresponds to an s-ary symbol at the output of channel mapping unit 6 and is recorded as the corresponding level in a respective s-ary cell of memory 2.

In embodiments where u=1 whereby q=r, then q-ary to r-ary conversion is of course not required and converter 5 can be omitted or bypassed. However, assuming r ! s then channel mapping may still be performed as described above, here for sets of v q-ary symbols. Similarly, in embodiment where r=s then channel mapper 6 can be omitted or bypassed. In general, therefore, symbol converter 4 may perform either or both of q-ary to r-ary conversion and channel mapping according to the particular parameters of the storage system. Note that the two-level coding technique described can also be applied to systems in which q=s, in which case the symbol converter 4 as a whole can be omitted or bypassed.

While the above system may offer exceptional flexibility of coding choice, two particularly interesting families of coding schemes for use in storage device 1 are described in the following.

The first family of coding schemes is characterized by r=s>2 and is particularly useful when the memory channel can be described by an s-ary channel model with independent s-ary symbol errors. The second family of coding schemes characterized by r=2 and k=u is particularly useful when the concatenation of the channel mapping unit, the memory channel, the readback process and the inverse channel mapping performed in decoder 7 can be described by a binary channel with independent bit errors. The independent bit error channel is a good model for nonvolatile s-level memories if Gray encoding is used as the channel mapping and errors in the nonvolatile memory channel result in a channel level being erroneously read as an adjacent channel level. In this case, $q=2^k$, r=2 and $s=2^v$. A good choice for an independent bit error channel would be to select a two-level binary BCH coding scheme where q=2, i.e., p=2 and k=1. However, it can be advantageous to use a code over GF(q), q>2, for reasons of implementation and/or error rate performance where the finite field arithmetic for encoding is performed in $GF(q=2^k)$, k>1.

Two specific examples of two-level codes for flash memory will now be described in detail. Currently a typical page in flash memory contains 4 KiB of user data. Furthermore, it is assumed that the available ECC redundancy per page is 224 bytes. When using a binary code, the code length MN must be 34560 (in bits) and the dimension of the code must be at least 32768 (in bits). Two binary two-level codes of length 34560=M×N=9×3840 will be constructed based on length-3840 binary BCH codes with decoding algorithms over $GF(2^{12})$.

In the first example, the binary two-level code C is constructed from a first binary BCH code $C_1$ with parameters [N=3840, $K_1$=3660, $d_1$=31], a second binary BCH code $C_2$ with parameters [N=3840, $K_2$=3492, $d_2$=59], and the single parity check code C* of length M=9, dimension K*=8 and d(C*)=2. The resulting two-level code has dimension 32772 and, therefore, it can accommodate 4 KiB user data. Furthermore, d(C)=59, i.e., the code can correct up to 29 errors.

In the second example, the binary two-level code C is constructed from a first binary BCH code $C_1$ with parameters [N=3840, $K_1$=3732, $d_1$=19], a second binary BCH code $C_2$ with parameters [N=3840, $K_2$=3528, $d_2$=53], and the shortened Hamming code C* of length M=9, dimension K*=5 and d(C*)=3. The resulting two-level code has dimension 32772 and, therefore, it can accommodate 4 KiB user data. Furthermore, d(C)=53, i.e., the code can correct up to 26 errors.

These binary two-level code examples over GF(2) should be compared to the binary BCH code with parameters [34560, 32768,225]. This long BCH code can correct up to 112 errors but its decoding algorithm operates in the large field $GF(2^{16})$, which is currently impractical for SSD memory applications.

Another comparison of the two-level codes described above is with respect to a 9-way interleaving scheme of a binary one-level BCH code with parameters [3840,3648,33], which can correct up to 16 errors. The decoder for each of the 9 interleaved BCH codes is operating over $GF(2^{12})$. Although the two-level codes have decoders operating over the same field $GF(2^{12})$, they can correct substantially more errors when compared to the simple 9-way interleaving scheme.

The use of matched-alphabet two-level BCH codes for page encoding in s-level flash as described above may provide highly efficient error correction coding. BCH codes are particularly suited to the error characteristics of s-level solid state storage such as non-volatile flash and PCM memory, the recording medium being subject to independent symbol errors where symbols are 1-bit to 4-bit long in current non-volatile memory products. Moreover, the improved error performance may be achieved with minimal impact on implementation complexity and power consumption. Exceptional overall performance may therefore obtained through use of the system described.

It will of course be appreciated that many changes and modifications can be made to the exemplary embodiments described without departing from the scope of the invention.

The invention claimed is:

1. A method for recording input data in s-level storage of a solid state storage device, where s f 2, the method comprising:
   encoding, by a processor, input data words in groups of M input data words in accordance with first and second BCH codes to produce, for each group, a set of M first codewords of the first BCH code such that a predetermined linear combination of the M first codewords produces a second codeword of the second BCH code, wherein the second BCH code is a sub-code of the first BCH code;
   recording the sets of M first codewords in the s-level storage;
   wherein each of the first and second codewords comprises N q-ary symbols where $q=p^k$, k is a positive integer and p is a prime number; and q and s are $u^{th}$ and $v^{th}$ powers respectively of a common base r, where u and v are positive integers and k f u, whereby $p^{(k/u)v}=s$;
   converting each q-ary first codeword into an r-ary first codeword prior to recording in the s-level storage; and
   mapping successive sets of v r-ary symbols of each r-ary first codeword to respective corresponding levels of the s-level storage in accordance with a predetermined mapping scheme, and recording each set of v r-ary symbols as said corresponding level in the s-level storage, wherein s ! q and r ! s.

2. The method of claim 1, wherein the sum of the M first codewords in said set is a said second codeword.

3. The method of claim 1, wherein each of a plurality of weighted sums of the M first codewords in said set is a respective second codeword, and wherein weighting coefficients for said plurality of weighted sums are defined by a parity-check matrix corresponding to a third, linear code.

4. The method of claim 1, wherein r=s>2.

5. The method of claim 1, wherein r=2 and k=u.

6. The method of claim 1, wherein s>2.

7. The method of claim 1, further comprising recording each set of M first codewords in a respective write location of the solid state storage.

8. A method for recording input data in s-level storage of a solid state storage device, where s f 2, the method comprising:
   encoding, by a processor, input data words in groups of M input data words in accordance with first and second BCH codes to produce, for each group, a set of M first codewords of the first BCH code such that a predetermined linear combination of the M first codewords produces a second codeword of the second BCH code, wherein the second BCH code is a sub-code of the first BCH code;

recording the sets of M first codewords in the s-level storage;

wherein each of the first and second codewords comprises N q-ary symbols where $q=p^k$, k is a positive integer and p is a prime number, and q and s are $u^{th}$ and $v^{th}$ powers respectively of a common base r, where u and v are positive integers and k f u, whereby $p^{(k/u)v}=s$, wherein s! q and q=r! s; and mapping successive sets of v q-ary symbols of each q-ary first codeword to respective corresponding levels of the s-level storage in accordance with a predetermined mapping scheme, and recording each set of v q-ary symbols as the corresponding level in the s-level storage.

9. A non-transitory computer program product comprising a computer readable storage medium having computer readable program code stored thereon that, when executed by a computer, implement a method of recording input data in s-level storage of a solid state storage device, the method comprising:

encoding, by a processor, input data words in groups of M input data words in accordance with first and second BCH codes to produce, for each group, a set of M first codewords of the first BCH code such that a predetermined linear combination of the M first codewords produces a second codeword of the second BCH code, wherein the second BCH code is a sub-code of the first BCH code;

recording the sets of M first codewords in the s-level storage;

wherein each of the first and second codewords comprises N q-ary symbols where $q=p^k$, k is a positive integer and p is a prime number, and q and s are $u^{th}$ and $v^{th}$ powers respectively of a common base r, where u and v are positive integers and k f u, whereby $p^{(k/u)v}=S$;

wherein s ! q and q=r ! s; and mapping successive sets of v q-ary symbols of each q-ary first codeword to respective corresponding levels of the s-level storage in accordance with a predetermined mapping scheme, and recording each set of v q-ary symbols as the corresponding level in the s-level storage.

10. An encoder apparatus configured to encode input data to be recorded in s-level storage of a solid state storage device, where s f 2, the encoder apparatus comprising:

a processor implemented, two-level BCH encoder configured to encode input data words in groups of M input data words in accordance with first and second BCH codes to produce, for each group, a set of M first codewords of the first BCH code such that a predetermined linear combination of the M first codewords produces a second codeword of the second BCH code, wherein the second BCH code is a sub-code of the first BCH code, wherein each of the first and second codewords comprises N q-ary symbols where q ! s, $q=p^k$, k is a positive integer and p is a prime number, and wherein q and s are $u^{th}$ and $v^{th}$ powers respectively of a common base r, where u and v are positive integers and k f u, whereby $p^{(k/u)v}=s$;

a symbol converter configured to convert the q-ary symbols of each first codeword to an s-ary alphabet for recording in the s-level storage;

wherein each of the first and second codewords comprises N q-ary symbols where $q=p^k$, k is a positive integer and p is a prime number, and q and s are $u^{th}$ and $v^{th}$ powers respectively of a common base r, where u and v are positive integers and k f u, whereby $p^{(k/u)v}=s$, wherein s ! q and q=r ! s; and the symbol converter including a channel mapping unit configured to map successive sets of v q-ary symbols of each q-ary first codeword to respective corresponding levels of the s-level storage in accordance with a predetermined mapping scheme, and recording each set of v q-ary symbols as the corresponding level in the s-level storage.

11. A solid state storage device comprising:

s-level solid state storage, where s f 2; and a two-level BCH encoder configured to encode input data words in groups of M input data words in accordance with first and second BCH codes to produce, for each group, a set of M first codewords of the first BCH code such that a predetermined linear combination of the M first codewords produces a second codeword of the second BCH code, wherein the second BCH code is a sub-code of the first BCH code, wherein each of the first and second codewords comprises N q-ary symbols where q ! s, $q=p^k$, k is a positive integer and p is a prime number, and wherein q and s are $u^{th}$ and $v^{th}$ powers respectively of a common base r, where u and v are positive integers and k f u, whereby $p^{(k/u)v}=s$, a symbol converter configured to convert the q-ary symbols of each first codeword to an s-ary alphabet for recording in the s-level storage;

a symbol converter configured to convert the q-ary symbols of each first codeword to an s-ary alphabet for recording in the s-level storage;

wherein each of the first and second codewords comprises N q-ary symbols where $q=p^k$, k is a positive integer and p is a prime number, and q and s are $u^{th}$ and $v^{th}$ powers respectively of a common base r, where u and v are positive integers and k f u, whereby $p^{(k/u)v}=s$, wherein s ! q and q=r ! s; and the symbol converter including a channel mapping unit configured to map successive sets of v q-ary symbols of each q-ary first codeword to respective corresponding levels of the s-level storage in accordance with a predetermined mapping scheme, and recording each set of v q-ary symbols as the corresponding level in the s-level storage.

* * * * *